United States Patent
Boyer et al.

[11] Patent Number: 6,074,885
[45] Date of Patent: Jun. 13, 2000

[54] LEAD TITANATE ISOLATION LAYERS FOR USE IN FABRICATING PZT-BASED CAPACITORS AND SIMILAR STRUCTURES

[75] Inventors: Leonard L. Boyer; Joseph T. Evans, Jr.; Naomi B. Velasquez, all of Albuquerque, N.Mex.

[73] Assignee: Radiant Technologies, Inc, Albuquerque, N.Mex.

[21] Appl. No.: 08/978,308

[22] Filed: Nov. 25, 1997

[51] Int. Cl.[7] .......................... H01L 29/94; H01L 21/314
[52] U.S. Cl. ................................. 438/3; 438/240
[58] Field of Search .................. 438/3, 240; 257/295

[56] References Cited

U.S. PATENT DOCUMENTS

| | | | |
|---|---|---|---|
| 3,683,211 | 8/1972 | Perlman et al. | 310/8.2 |
| 5,206,788 | 4/1993 | Larson et al. | 361/313 |
| 5,242,534 | 9/1993 | Bullington et al. . | |
| 5,270,298 | 12/1993 | Ramesh | 505/1 |
| 5,326,721 | 7/1994 | Summerfelt . | |
| 5,393,352 | 2/1995 | Summerfelt . | |
| 5,426,075 | 6/1995 | Perino et al. . | |
| 5,506,748 | 4/1996 | Hoshiba | 361/321.4 |
| 5,572,052 | 11/1996 | Kashihara et al. | 257/295 |
| 5,650,362 | 7/1997 | Nashimoto . | |
| 5,650,646 | 7/1997 | Summerfelt | 257/295 |
| 5,661,062 | 8/1997 | Prinz | 438/3 |
| 5,714,194 | 2/1998 | Komai et al. | 427/81 |
| 5,731,220 | 3/1998 | Tsu et al. . | |
| 5,736,449 | 4/1998 | Miki et al. . | |
| 5,739,563 | 4/1998 | Kawakubo et al. | 257/295 |
| 5,781,404 | 7/1998 | Summerfelt et al. | 361/321.5 |
| 5,796,648 | 8/1998 | Kawakubo et al. | 365/145 |
| 5,798,903 | 8/1998 | Dhote | 257/295 |
| 5,817,170 | 10/1998 | Desu et al. | 117/2 |
| 5,851,896 | 12/1998 | Summerfelt . | |
| 5,936,832 | 8/1999 | Saito | 257/295 |

FOREIGN PATENT DOCUMENTS 403034580  2/1991  Japan .

*Primary Examiner*—Charles Bowers
*Assistant Examiner*—Matthew Whipple
*Attorney, Agent, or Firm*—Calvin B. Ward

[57] ABSTRACT

A method for constructing a device having a bottom electrode in contact with a layer of a ferroelectric dielectric material. In the method of the present invention, a layer of a field ferroelectric material is deposited on a substrate and etched to form a trench in which the bottom electrode is constructed. The bottom electrode is then deposited and a layer of the ferroelectric dielectric material is deposited over the bottom electrode and at least a portion of the field ferroelectric material. The ferroelectric layers are deposited in a perovskite state. These layers are etched back to the substrate in those areas that are outside of the device.

5 Claims, 2 Drawing Sheets

LEAD TITANATE ISOLATION LAYERS FOR USE IN FABRICATING PZT-BASED CAPACITORS AND SIMILAR STRUCTURES

FIELD OF THE INVENTION

The present invention relates to integrated circuits, and more particularly, to methods of constructing PZT containing structures on integrated circuits.

BACKGROUND OF THE INVENTION

Ferroelectric based capacitors are increasing in demand as integrated circuit elements. Capacitors having the lead titanium zirconate (PZT) family of dielectrics offer large dielectric constants which, in turn, make the construction of small capacitors with relatively large capacitances possible. A ferroelectric capacitor consists of a PZT layer sandwiched between two planar electrodes. Capacitors utilizing platinum electrodes are particularly advantageous, since such capacitors exhibit excellent crystallinity compared to capacitors utilizing other electrode materials.

Ferroelectric based field-effect transistors are also known to the art. These transistors have a structure which may be viewed as a capacitor in which the top electrode has been replaced by a semi-conductor layer having two separated contacts corresponding to the source and drain of the transistor. The bottom electrode and ferroelectric layer are constructed in essentially the same manner as the bottom electrode and ferroelectric layer of a ferroelectric capacitor.

An integrated circuit utilizing ferroelectric capacitor-like structures is typically constructed in two phases. First, the conventional CMOS circuits which connect to the ferroelectric devices are constructed in the silicon substrate. A protective layer of $SiO_2$ is then placed over the CMOS devices and the ferroelectric devices constructed on the protective layer or on a second protective layer deposited over the $SiO_2$ layer. The ferroelectric devices are connected to the underlying CMOS devices by etching vias in the protective layer.

The bottom electrode and ferroelectric layer of a ferroelectric structure are typically constructed by depositing a patterned bottom electrode on the protective layer and then covering the surface with the ferroelectric layer. The top electrodes are then deposited and the electrode/ferroelectric layer is stack etched back to the protective layer.

For example, U.S. Pat. No. 5,242,534 describes a construction method in which a titanium oxide layer is formed over the $SiO_2$ layer. A layer of titanium is then deposited, and the layer is masked and etched in those regions that are to become the bottom electrode leaving a trench in the titanium layer. The bottom electrode, typically platinum or a titanium/platinum stack, is then deposited in the trench. The mask is then removed and the exposed titanium is oxidized. This leaves the regions between the bottom electrodes covered with titanium oxide and the bottom electrode recessed in the titanium oxide layer. The PZT dielectric layer is then deposited over the wafer. The top electrodes are typically deposited as a uniform layer. The top electrodes and dielectric layer are then stack etched back to the titanium oxide layer in the regions between the capacitor-like structures.

For the purposes of the present discussion, the regions between the capacitors will be referred to as the "field". The above described process requires the PZT dielectric layer to crystallize both over the platinum electrodes and in the field. The PZT compositions typically utilized for the dielectric layer can form two types of crystals, perovskite and pyrochlore. The PZT compositions and deposition conditions are chosen such that the portion of the layer that crystallizes over the platinum electrode is all perovskite. Unfortunately, these compositions and conditions do not lead to a pure perovskite layer over the titanium oxide in the field. Typically, the field contains a mixture of perovskite and pyrochlore.

The respective etch rates for perovskite and pyrochlore structures differ significantly, with pyrochlore structures etching at a much slower rate than perovskite structures. As a result, the stack etch leaves pyrochlore islands in the field. These structures make it difficult to etch the vias used to connect the ferroelectric structures to the underlying CMOS circuits in the field.

Broadly, it is the object of the present invention to provide an improved method for constructing ferroelectric based devices.

It is a further object of the present invention to provide a method for constructing ferroelectric based devices that do not lead to pyrochlore islands in the field region.

These and other objects of the present invention will become apparent to those skilled in the art from the following detailed description of the invention and the accompanying drawings.

SUMMARY OF THE INVENTION

The present invention is a method for constructing a device having a bottom electrode in contact with a layer of a ferroelectric dielectric material. In the method of the present invention, a layer of a field ferroelectric material is deposited on a substrate. The bottom electrode is then deposited and a layer of the ferroelectric dielectric material is deposited over the bottom electrode and at least a portion of the field ferroelectric material. The dielectric ferroelectric layer that crystallizes over the field ferroelectric material is substantially all in the same crystalline state which is preferably the perovskite state. These layers are etched back to the substrate in those areas that are outside of the device.

DETAILED DESCRIPTION OF THE INVENTION

The problems discussed above would be eliminated if the ferroelectric layer used for the dielectric crystallized completely as either a pyrochlore or perovskite. As long as the material is all of one type, the dielectric layer in the field can be etched back to the protective layer without leaving the islands of pyrochlore discussed above. In the preferred embodiment of the present invention, the dielectric layer in the field is perovskite, since this form is easier to etch.

The preferred embodiment of the present invention is based on the observation that certain doped lead titanate compositions (PLT or PLZT) crystallize so quickly that these compositions do not require a nucleation source on the underlying surface to fully crystallize in the perovskite phase. Unfortunately, these compositions do not provide optimal electrical properties; hence, they cannot be used for the dielectric layer in the ferroelectric device. In the present invention, lanthanum doped lead titanate is used in the field region on top of the titanium oxide.

Figure 1:
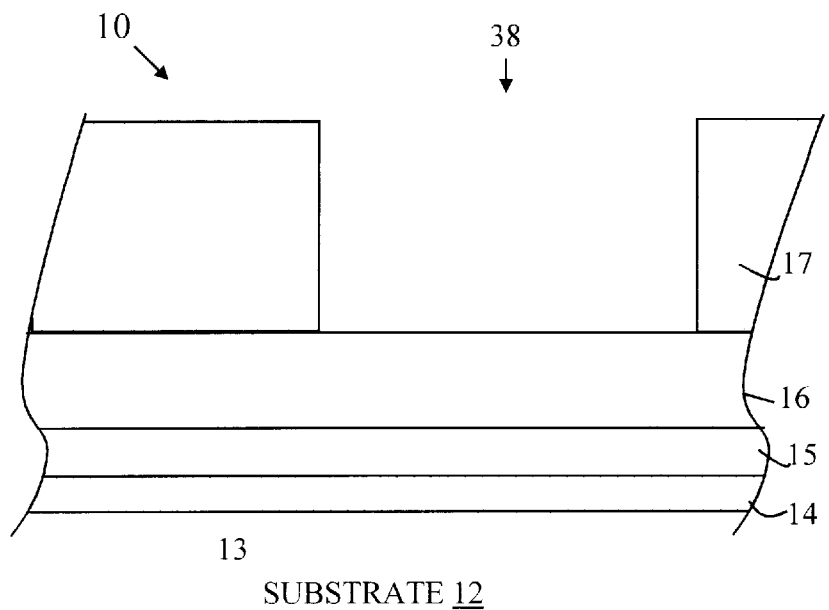
FIGS. 1–4 are cross-sectional views of the construction of a capacitor at various stages in a construction process according to the present invention.

Refer now to FIGS. 1–4 which are cross-sectional views of the construction of a capacitor 10 at various stages in the construction process. Referring to FIG. 1, capacitor 10 is constructed on a substrate 12 which is presumed to have the circuitry to which capacitor 10 is to be connected. A protective layer of $SiO_2$ 14 is assumed to cover substrate 12. However, other protective layers may be utilized.

A layer 15 of titanium oxide is first deposited over layer 14. This layer is preferably formed by depositing a layer of metallic titanium, typically 200 Å thick, and then oxidizing this layer by heating in an oxygen environment. Next, a layer 16 of PLT or PLZT, typically 400 Å thick is deposited on layer 15. A photoresist mask 17 is then deposited and patterned to leave layer 16 exposed in the region 38 to be occupied by the bottom electrode of the capacitor. The mask must be of sufficient thickness to accommodate the bottom electrode after the etching step discussed below.

PLT layer 16 is then etched back to titanium oxide layer 15 to create a trench in which the bottom electrode is to be deposited. A wet etch utilizing 1:1:3 $HCL/BOE(6:1)/H_2O$ may be used for this step. It should be noted that a portion of the titanium oxide layer 15 may also be etched away if a suitable etchant is utilized.

Figure 2:
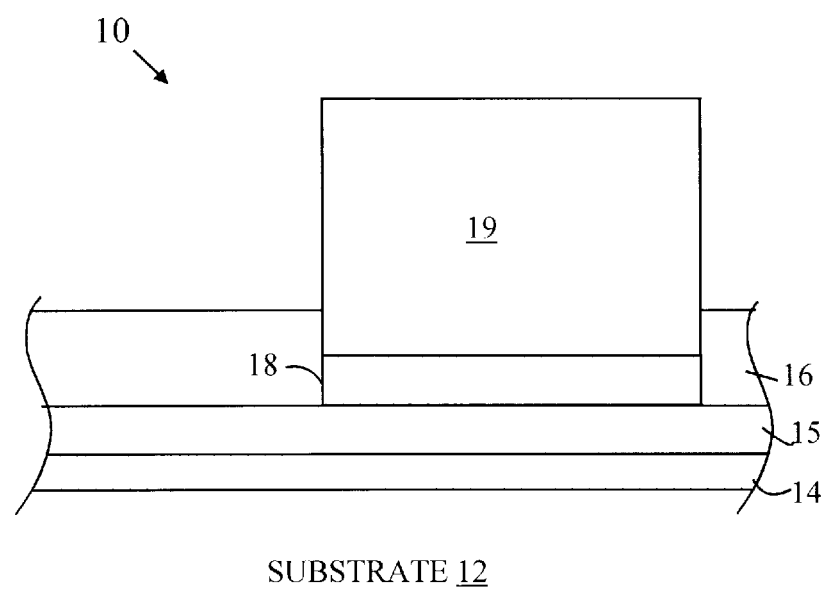

The bottom electrode is next deposited through the photoresist mask 17. In the preferred embodiment of the present invention, the bottom electrode consists of a layer of titanium 18 and a layer of platinum 19. The preferred thicknesses for these layers are 50 Å and 1500 Å, respectively. The titanium layer improves the adhesion of the bottom electrode. After the deposition of the platinum layer, the photoresist mask is removed leaving the bottom electrode in a trench in the PLT layer as shown in FIG. 2. The bottom electrode is then annealed in an oxygen environment to harden the electrode prior to the deposition of the ferroelectric dielectric layer.

Figure 3:
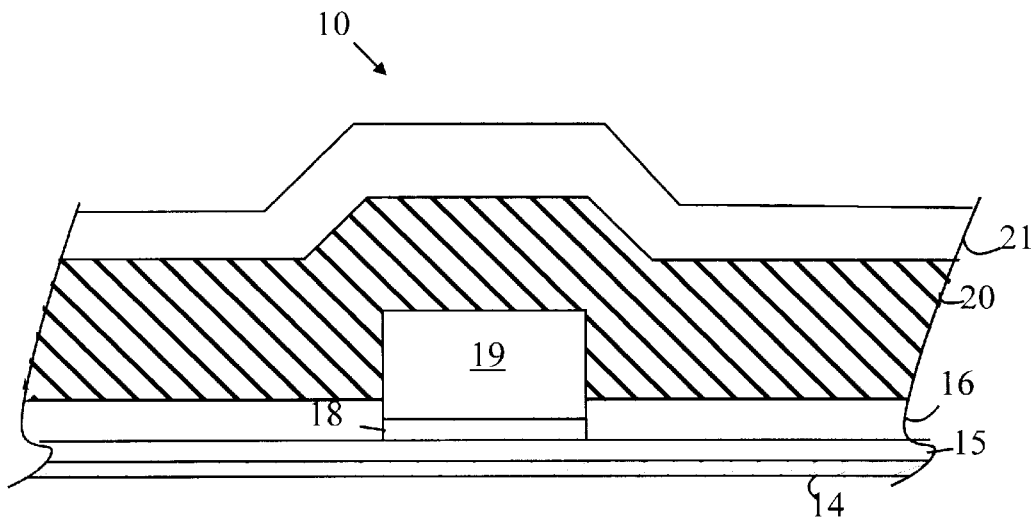
Figure 4:
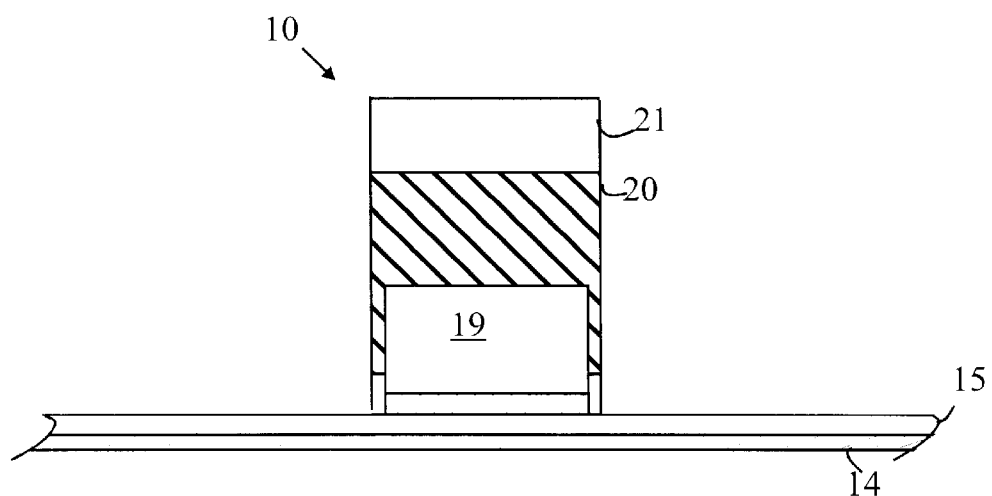

Refer now to FIG. 3. After the construction of the bottom electrode, a dielectric layer 20 comprising the electrical PZT, PLZT, or PNZT material is deposited over the bottom electrode and sintered. A platinum layer 21 is then deposited over dielectric layer 20. The platinum layer will become the top electrode of capacitor 10. The various layers are then etched. The portion of the dielectric layer in the field region is etched back to the titanium oxide layer 15 leaving capacitor 10 as shown in FIG. 4.

The top electrode may be formed by stack etching the dielectric and platinum layers. Alternatively, the top electrode may be patterned separately using a lift off process.

It should be noted that the both layer 20 and layer 16 are perovskite. Hence, the problems encountered when the field area contained pyrochlore regions have been eliminated and the etch will proceed cleanly to the underlying titanium oxide layer.

The etch rates of the ferroelectric layers depend on the dopant concentrations utilized in each layer. Accordingly, in the preferred embodiment of the present invention, the compositions of the field ferroelectric material is chosen to follow that of the dielectric material. For example, if 4/20/80 PNZT is used for the dielectric layer 20, 15/0/100 PLZT is used for the field dielectric layer 16.

The above described embodiments of the present invention utilized a procedure in which the field ferroelectric material is deposited and sintered prior to etching the trench for the bottom electrode. However, embodiments in which the field ferroelectric material is patterned and etched to form the trench prior to sintering may also be utilized. Since it is easier to etch the ferroelectric material prior to sintering, this embodiment of the present invention can provide better control of the dimensions of the bottom electrode. It does, however, require a second masking step for depositing the bottom electrode.

As noted above, the present invention may also utilize embodiments in which the dielectric material in the field region crystallizes as pyrochlore. While this material is more difficult to etch, the layer can still be etched back at a uniform rate, thereby leaving the top surface of the protective layer free of islands that might interfere with subsequent deposition steps.

While the above embodiments have been described in terms of particular combinations of PNZT and PLZT layers, other combinations of material may also be utilized. For example, the field layer may also be constructed from PLT or PNZT provided the concentrations of the components provides a surface in which the crystallization of the subsequently deposited dielectric layer results in a single crystalline phase. Dielectric layers may be constructed from PZT, PLZT, PNZT or other materials currently used for dielectric layers in ferroelectric-based capacitors.

Various modifications to the present invention will become apparent to those skilled in the art from the foregoing description and accompanying drawings. Accordingly, the present invention is to be limited solely by the scope of the following claims.

What is claimed is:

1. A method for constructing a device having a bottom electrode in contact with a layer of a ferroelectric dielectric material, said method comprising the steps of:

depositing a layer of a field ferroelectric material on a substrate;

depositing said bottom electrode;

depositing a layer of said ferroelectric dielectric material on said bottom electrode and on at least a portion of said layer of said field ferroelectric material; and etching said layer of said ferroelectric dielectric material and said field ferroelectric material in regions not occupied by said device, wherein said field ferroelectric material and said ferroelectric dielectric material are chosen such that said layer of dielectric material that crystallizes over said field ferroelectric material is substantially all in the same crystalline state at the time of said etching.

2. The method of claim 1 wherein said field material and said dielectric material are chosen such that the portion of said dielectric layer over said field ferroelectric material is perovskite.

3. The method of claim 1 wherein said ferroelectric dielectric material and said field ferroelectric material have substantially the same etch rates.

4. The method of claim 1 wherein said ferroelectric dielectric material is chosen from the group consisting of PZT, PNZT, and PLZT.

5. The method of claim 1 wherein said field ferroelectric dielectric material is chosen from the group consisting of PLT, PLZT, and PNZT.

* * * * *